United States Patent [19]

Matsukawa

[11] 4,419,142

[45] Dec. 6, 1983

[54] METHOD OF FORMING DIELECTRIC ISOLATION OF DEVICE REGIONS

[75] Inventor: Naohiro Matsukawa, Yokohama, Japan

[73] Assignee: Tokyo Shibaura Denki Kabushiki Kaisha, Japan

[21] Appl. No.: 313,324

[22] Filed: Oct. 20, 1981

[30] Foreign Application Priority Data

| | | | |
|---|---|---|---|
| Oct. 24, 1980 | [JP] | Japan | 55-148363 |
| Oct. 31, 1980 | [JP] | Japan | 55-153250 |
| Jul. 3, 1981 | [JP] | Japan | 56-104122 |

[51] Int. Cl.³ .................... H01L 21/312; C03C 15/00; B01J 17/00

[52] U.S. Cl. ........................................ 148/1.5; 29/571; 29/578; 148/187; 427/93

[58] Field of Search .................. 148/1.5, 187; 29/571, 29/578; 427/93

[56] References Cited

U.S. PATENT DOCUMENTS

| | | | |
|---|---|---|---|
| 3,897,282 | 7/1975 | White | 427/93 |
| 3,911,168 | 10/1975 | Schinella et al. | 427/93 |
| 4,127,931 | 12/1978 | Shiba | 29/578 |
| 4,178,396 | 12/1979 | Okano et al. | 427/93 |
| 4,179,311 | 12/1979 | Athanas | 148/1.5 |
| 4,251,571 | 2/1981 | Gabarino et al. | 29/571 |

*Primary Examiner*—Upendra Roy

*Attorney, Agent, or Firm*—Finnegan, Henderson, Farabow, Garrett & Dunner

[57] ABSTRACT

A method of manufacturing a semiconductor device which comprises the steps of: forming on a semiconductor substrate a layer of a material more quickly oxidizable than the semiconductor substrate; selectively oxidizing only that portion of the layer which is mounted on the element region of the semiconductor substrate; removing at least part of said oxidized layer; and wet oxidizing the retained portion of said more oxidizable material layer to provide an element-isolating oxide layer.

13 Claims, 12 Drawing Figures

29 29 30 28 28 22 p+ p+ 26 P 21

38 36 33 37 39 29 29 28 28 22 p+ n+ n+ p+ 26 34 32 35 P 21

METHOD OF FORMING DIELECTRIC ISOLATION OF DEVICE REGIONS

BACKGROUND OF THE INVENTION

This invention relates to a method of manufacturing a semiconductor device and more particularly a method of manufacturing a semiconductor device which is adapted for the isolation of an element by an insulation material.

Hitherto, the element of a semiconductor device has been isolated by forming the so-called field oxide layer by selective oxidation around that region of a semiconductor substrate in which the element is formed. The technique of isolating the element of the semiconductor device indeed has an advantage of helping to facilitate the high density integration of a semiconductor device and simplify its manufacturing process, but is accompanied with the undermentioned noticeable drawbacks.

In the first place, an oxide layer for isolation of the semiconductor element is embedded in a semiconductor substrate, giving rise to a serious deformation of the substrate and sometimes crystalline defects like oxidation-induced stacking faults (abbreviated as OSF) and dislocations, and consequently deteriorating the electric property of the semiconductor element. To avoid the occurrence of such deformation and stacking faults, it is necessary to impose a rigid limitation on the structure of the element and thickness of an oxidation-resistant mask and the condition of selective oxidation and sometimes the selection of a semiconductor substrate itself. Reference was previously made to said first drawback in "High Pressure Oxidation for Isolation of High Speed Bipolar Devices", IEDM (1979), pages 340 to 343.

In the second place, the formation of a field oxide layer for isolation of semiconductor elements consumed long hours of oxidation, adversely affecting the diffusion and redistribution of an impurity of a channel stopper. Long hours of field oxidation leads to a broad lateral diffusion of an impurity layer, decreasing the effective channel width of a MOS transistor and increasing the drain junction capacity of said transistor, and consequently obstructing the development of a high speed semiconductor device. Further, it is necessary to increase the dose of ion implantation, and elevate acceleration voltage in consideration of the effect of the redistribution of an impurity into an oxidized layer, thus decreasing the yield of a semiconductor device due to damage caused by excess ion implantation.

The third drawback is that where the formation of an oxide layer for isolation of semiconductor elements is effected by selective oxidation with a nitride layer used as an oxidation-resistant mask, then a silicon nitride layer known as a white ribbon is produced on a silicon substrate under the nitride layer at the tip of the bird's beak, reducing the breakdown voltage of a semiconductor element.

SUMMARY OF THE INVENTION

It is accordingly an object of this invention to provide a method of manufacturing a semiconductor device having excellent electric properties which can form an oxide layer for isolation of semiconductor elements without giving rise to defects in a semiconductor substrate.

Another object of the invention is to provide a method of manufacturing a semiconductor device which can produce a conductive layer together with the formation of an oxide layer for isolation of semiconductor elements.

To attain the above-mentioned object, this invention provides a method of manufacturing a semiconductor device which comprises the steps of:

(a) forming on a semiconductor substrate a layer of a material which can be more quickly oxidized than said semiconductor substrate (hereinafter referred to as "the quickly oxidizable material layer");

(b) selectively oxidizing the quickly oxidizable material layer deposited on that region of the semiconductor substrate on which an element is formed (hereinafter referred to as "the element region of the semiconductor substrate") to provide an oxidized layer;

(c) etching at least part of the oxidized layer deposited on the element region of the semiconductor substrate;

(d) wet oxidizing the remaining portion of the quickly oxidizable material layer to provide an oxide layer for isolation of the element, the oxidized layer remaining on the element region of the semiconductor substrate being made thinner than the other oxide layer; and (e) etching said thin oxidized layer remaining on the element region of the semiconductor substrate.

A modification of a semiconductor device-manufacturing method embodying this invention comprises the steps of:

forming a thin insulation layer on the semiconductor substrate prior to the aforementioned step (a); and carrying out the steps of (a) to (e), during which, however, the quickly oxidizable material layer retained during step (d) is wet oxidized so as to cause a nonoxidized portion to remain in the oxide layer, thereby making it possible to use the nonoxidized portion as a conductive layer.

DETAILED DESCRIPTION OF THE PREFERRED EMBODIMENTS

A material used in the semiconductor device-manufacturing method of this invention which is oxidized more quickly than the semiconductor substrate includes polycrystalline silicon undoped or doped with an impurity such as phosphorus, arsenic or boron; and metal silicides such as molybdenum silicide, tantalum silicide and tungsten silicide. The thickness of the previously defined quickly oxidizable material layer varies with the thickness demanded of an element-isolating oxide layer produced by oxidizing the material layer. In other words, the thickness can be properly selected according to the level of breakdown voltage required for the resultant semiconductor device.

An oxidized layer deposited on the element region of the semiconductor substrate by selectively oxidizing the quickly oxidizable material layer may be completely etched off. However, only part of the oxidized layer may be removed to protect the element region of the semiconductor substrate from the subsequently effected wet oxidation. Where, in this case, the retained oxidized layer has too great a thickness, then the element-isolating oxide layer will be rendered too thin when the element region of the semiconductor substrate is exposed by removing the retained oxidized layer. It is therefore preferred to remove about three-fourths of the oxidized layer, and leave about one-fourths of the oxidized layer on the element region of the semiconductor substrate.

Where the succeeding wet oxidation is carried out in an atmosphere of a burning hydrogen gas at a low temperature, then the quickly oxidizable material layer alone is oxidized to provide an element-isolating oxide layer. In this case, the semiconductor substrate, even if exposed, is oxidized only to an extremely small thickness. Therefore, the element-isolating oxide layer thus formed is not embedded in the semiconductor substrate, preventing deformations or other defects from arising in the semiconductor substrate, and giving no adverse effect on an impurity layer which happens to be present in the channel stopper. The element-isolating oxide layer formed by wet oxidizing the quickly oxidizable material layer has a much greater thickness than the oxidized layer present or retained on the element region of the semiconductor substrate.

Description is now given with reference to FIGS. 1 to 6 of an n-channel MOS semiconductor device whose manufacture has been effected by the method of this invention.

Figure 1:
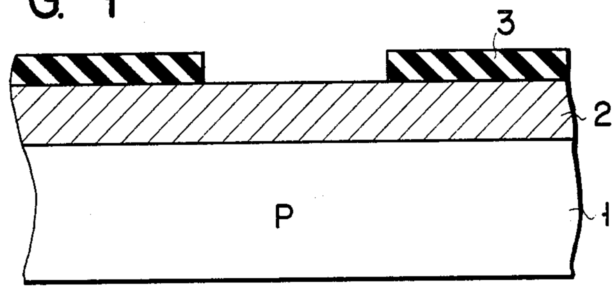
FIGS. 1 to 6 are longitudinal sectional views showing the sequential steps of manufacturing a semiconductor device according to one embodiment of this invention.

As shown in FIG. 1, a polycrystalline silicon layer 2 is deposited on a p-type single crystal silicon substrate 1 by gas phase growth in an atmosphere of $POCl_3$. It is possible to apply another process which comprises the steps of depositing an insulation layer formed of, for example, silicon oxide or nitrogen oxide with a small thickness of, for example, 1,000 to 2,000 Å before the deposition of the polycrystalline silicon layer 2 and mounting a polycrystalline silicon layer on the insulation layer. This insulation layer may be formed of a silicon oxide layer laminated with a silicon nitride layer. Since, in the latter case, the semiconductor substrate 1 is fully protected by said laminated insulation layers, the object is well served, even if the polycrystalline silicon layer is insufficiently oxidized. It is possible to dope the polycrystalline silicon layer with a highly concentrated impurity. Later, a silicon nitride layer with a thickness of 3,000 Å is mounted on the polycrystalline silicon layer 2 to provide an oxidation-resistant mask pattern 3 by a photoetching process.

Figure 2:
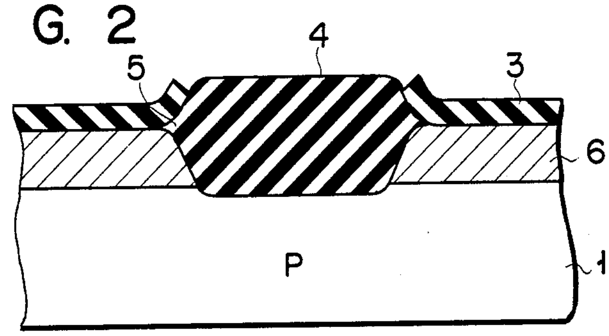
Figure 3:
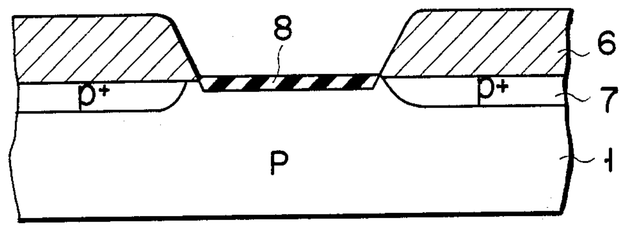

Next, as shown in FIG. 2, the exposed polycrystalline silicon layer 2 is selectively wet oxidized with the silicon nitride pattern 3 used as an oxidation-resistant mask to form an oxidized layer 4 with a thickness of 9,000 Å. Oxidation proceeds crosswise between the oxidation-resistant mask 3 and polycrystalline silicon layer 2 to produce the so-called bird's beak 5. After removal of the silicon nitride pattern 3, an impurity having the same conductivity type as the semiconductor substrate such as boron, is ion implanted and then activated. At this time, the thick oxidized layer 4 acts as a mask, causing the boron to be implanted in the semiconductor substrate 1 through the retained polycrystalline layer 6. The boron is later activated to provide a $p^+$-type inversion-preventing layer 7 as shown in FIG. 3. If, in this case, a p-type impurity is contained in the silicon substrate 1 at a sufficiently high concentration, it is unnecessary to form the aforementioned $p^+$-type inversion-preventing layer 7.

Figure 4:
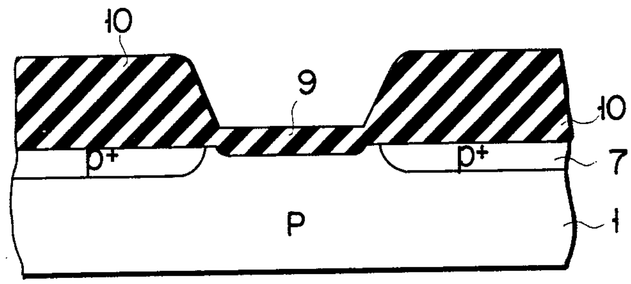

As shown in FIG. 3, the oxidized layer 4 is partly removed by an ammonium fluoride solution to retain a thin oxidized layer 8 having a thickness of about 2,000 Å on the element region of the semiconductor substrate. After removal of the oxidized layer 4 having the so-called bird's beak 5, the inner wall of the resultant cavity formed in the retained polycrystalline layer 6 has a gently inclined plane. The silicon nitride pattern 3 used as an oxidation-resistant mask may be removed before or after the elimination of the oxidized layer 4. Thereafter as shown in FIG. 4, wet oxidation is applied for 300 minutes at a temperature of 850° C. in an atmosphere of burning hydrogen gas to oxidize the whole of the retained polycrystalline layer 6, thereby providing a oxide layer 10 which has a thickness of 9,000 Å and whose inner peripheral wall constitutes a gently inclined plane. At this time, the element region of the semiconductor substrate 1 is slightly oxidized to produce an oxidized layer 9 having a thickness of about 2,700 Å. The polycrystalline silicon layer alone is oxidized by the wet oxidation, whereas the silicon substrate is little oxidized. Therefore, an element-isolating oxidized layer thus formed is not embedded in the substrate 1.

Figure 5:
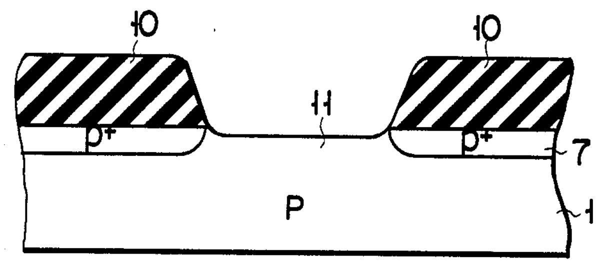

Later, as shown in FIG. 5, the thin oxidized layer 9 is etched off, until the underlying substrate 1 is exposed. At this time, the surrounding thick oxide layer 10 has its thickness reduced to the same extent as the thickness of the thin oxidized layer 9, thereby providing an element-isolating oxide layer around the element region 11 of the semiconductor substrate 1.

Figure 6:
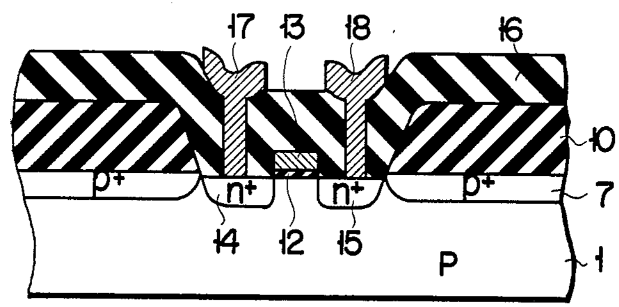

Thereafter, a MOS transistor is provided in the element region 11 of the semiconductor substrate 1 by the conventional process. As shown in FIG. 6, a polycrystalline silicon gate electrode 13 is formed above the island-shaped element region of the semiconductor substrate 1 with a gate oxide layer 12 interposed therebetween. Phosphorus is thermally diffused in the semiconductor substrate 1 with the gate substrate 13 used as a mask to produce $n^+$ source region 14 and $n^+$ drain region 15. Further, a CVD-$SiO_2$ layer 16 is mounted on said $n^+$ source and drain regions 14, 15. A contact hole is formed in those portions of said CVD-$SiO_2$ layer 16 which face the $n^+$ source and drain regions 14, 15. Aluminum electrodes 17, 18 are respectively connected through the contact hole to the $n^+$ source and drain regions 14, 15 by the vacuum deposition of an aluminum layer and patterning, thereby producing an n-channel MOS transistor.

Description is now given with reference to FIGS. 7 to 12 of a semiconductor-manufacturing device according to another embodiment of this invention. With this embodiment, the quickly oxidizable material layer is oxidized in such a manner that inner part of the material layer remains unoxidized. Said unoxidized portion is used as a conductive layer.

Figure 7:
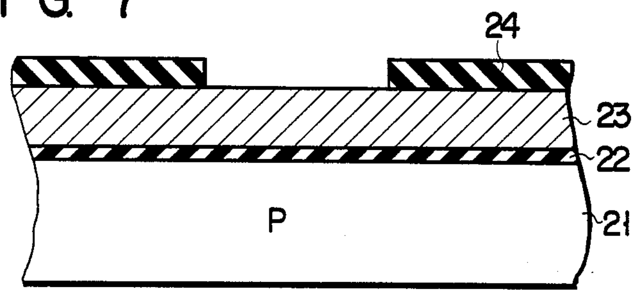
FIGS. 7 to 12 are longitudinal sectional views illustating the sequential steps of manufacturing a semiconductor device according to another embodiment of the invention.
Figure 8:
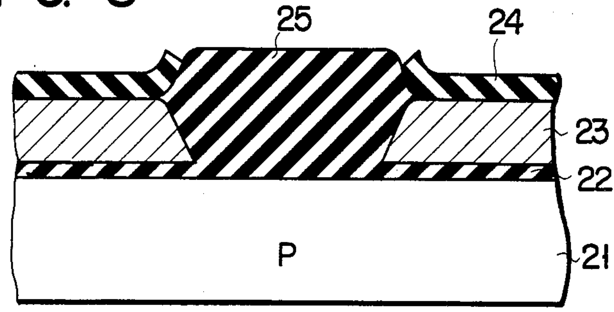
Figure 9:
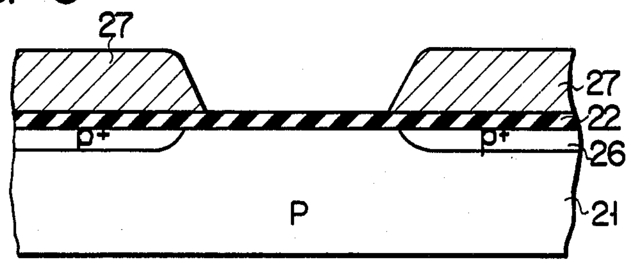
Figure 10:
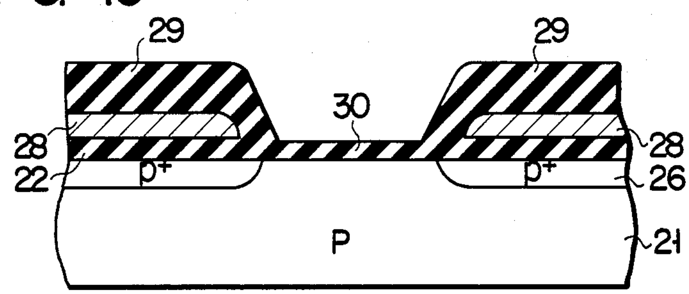
Figure 11:
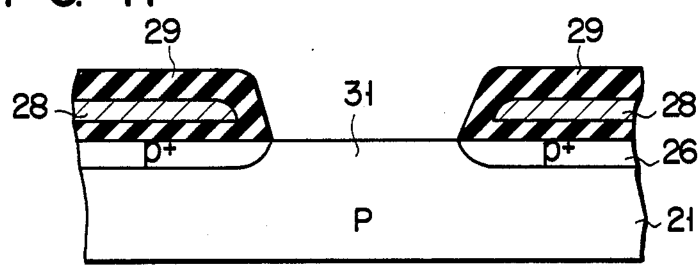
Figure 12:
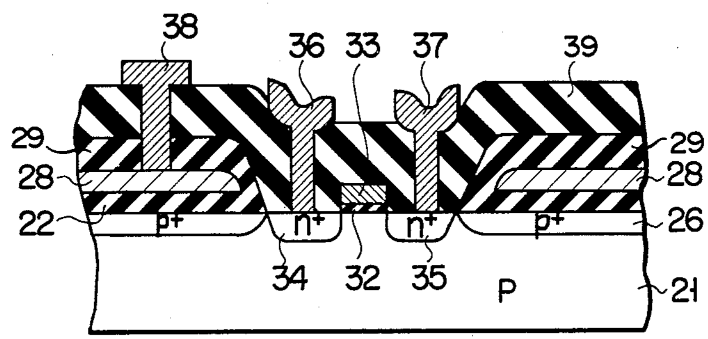

As shown in FIG. 7, a p-type single crystal silicon substrate 21 is thermally oxidized to produce a thermally oxidized layer 22 with a thickness of 1,000 Å on the main plane of the silicon substrate 21. A polycrystalline silicon layer 23 is deposited on the thermally oxidized layer 22 by gas phase growth in an atmosphere of $POCl_3$. A phosphorus-doped polycrystalline silicon layer 23 more quickly oxidizable than the single crystal silicon substrate 21 is formed with a thickness of 4,000 Å. After a silicon nitride pattern 24 is formed as an oxidation-resistant mask, the exposed portion of the polycrystalline silicon layer 23 is selectively oxidized to form an oxidized layer 25 with a thickness of 9,000 Å as shown in FIG. 8. Even if oxidation is somewhat carried to excess in this case, the semiconductor substrate 21 is prevented from being oxidized by the thermally oxidized layer 22. However, a silicon nitride layer is more preferable than the oxidized layer 22, because the former has a greater oxidation-preventing effect than the latter. After the removal of the silicon nitride pattern 24 and the formation of the $p^+$-type channel stopper 26, the oxidized layer 25 is etched by an ammonium fluoride solution in such a manner that the underlying thermally oxidized layer 22 is retained. At this time, a cavity having a gently inclined inner peripheral wall is formed in a retained polycrystalline silicon layer 27 as shown in FIG. 9.

Where wet oxidation is carried out for 200 minutes at a temperature of 850° C. in an atmosphere of a burning hydrogen gas, then the retained polycrystalline silicon layer 27 having a thickness of 4,000 Å is oxidized, causing a polycrystalline silicon layer 28 having a thickness of 1,000 Å to be retained on the thermally oxidized layer 22 as shown in FIG. 10. As a result, an element-isolating oxide layer 29 having a thickness of 6,000 Å is formed. The cavity formed in the element-isolating oxide layer 29 has a gently inclined inner peripheral wall. At this time, that portion of the thermally oxidized layer 22 which is exposed on the element region of the semiconductor substrate 21 is slightly oxidized to produce an oxidized layer 30 having a thickness of about 2,200 Å. Later, as shown in FIG. 11, the oxidized layer 30 is removed to expose the underlying semiconductor substrate 21, thereby producing an element region 31 surrounded by the element-isolating oxide layer 29. Last, as shown in FIG. 12, a gate oxide layer 32 and overlying gate electrode 33 are formed by the conventional process to provide an $n^+$ source region 34 and drain region 35. A $SiO_2$ layer 39 deposited on the element-isolating oxide layer 29 by the CVD process is penetrated by a contact hole extending to the source region 34 and drain region 35 and a contact hole extending to the polycrystalline silicon layer 28, thereby respectively providing aluminum electrodes 36, 37, 38.

In the foregoing embodiment, an aluminum electrode 38 is connected to the retained polycrystalline silicon layer 28 as shown in FIG. 12. However, this process need not be exclusively followed. It is possible to take the step of forming a hole in part of that portion of the oxidized layer 22 overlying the semiconductor substrate 21 in which a field region is to be formed before the deposition of the aforesaid polycrystalline silicon layer 27 on said oxidized layer 22 in order to effect contact between the semiconductor substrate 21 and polycrystalline silicon layer 27, and then shield the retained polycrystalline silicon layer 28 after the subsequent thermal oxidation.

This invention is applicable not only to the manufacture of a MOS IC of the above-mentioned embodiment but also to a bipolar IC and $I^2L$, etc.

A semiconductor device-manufacturing method embodying this invention offers the following advantages:

(1) During the formation of an element-isolating oxide layer, a layer of quickly oxidizable material mounted on a semiconductor substrate is wet oxidized, preventing stresses from being applied to the semiconductor substrate. Further, a thick oxide layer thus obtained is not embedded in the semiconductor substrate, thereby avoiding the occurrence of a crystalline defects such as the previously mentioned OSF and dislocations. Consequently, it is possible to manufacture with good yield a semiconductor device having a satisfactory element property and high reliability.

(2) A quickly oxidizable material such as polycrystalline silicon is oxidized to produce an oxide layer, enabling thermal oxidation to be effected in a short time at a low temperature. Therefore, it is possible to assure the improvement of the economical phase of the semiconductor device-manufacturing method, the elimination of difficulties resulting from thermal stresses and the prevention of the rediffusion of impurities in the semiconductor substrate.

(3) Even where, during selective oxidation, white ribbons appear on a polycrystalline silicon layer under a silicon nitride pattern at the tip of the bird's beak acting as an oxidation-resistant mask, the polycrystalline silicon layer can be oxidized to provide an element-isolating oxide layer without etching the defection portion. Therefore, the white ribbons are prevented from adversely affecting not only the silicon semiconductor substrate but also the formation of the element-isolating oxide layer.

(4) The inner wall of a cavity formed in the element-isolating oxide layer which faces the element region of the semiconductor substrate has a gently inclined plane, preventing the breakage of a conductor.

(5) The retained polycrystalline silicon layer in the thick element-isolating oxide layer in a field region has a small specific resistivity and acts as part of a shield or internal wiring due to the division of a potential capacity, even without being contacted by any extra wiring, thereby enabling the resultant semiconductor device to have a high breakdown voltage. Particularly, application of the retained polycrystalline silicon layer decreases the frequency of carrying out patterning and assures high density integration.

What is claimed is:

1. A method of manufacturing a semiconductor device which comprises the steps of:

(a) depositing on a semiconductor substrate a layer of a material which is oxidized more quickly than said semiconductor substrate;

(b) selectively oxidizing that portion of said more quickly oxidizable material layer which is located on the element region of the semiconductor substrate to provide an oxidized layer;

(c) removing at least part of said oxidized layer deposited on the element region of the semiconductor substrate;

(d) wet oxidizing the retained layer of said more quickly oxidizable material to produce an element-isolating oxide layer with a greater thickness than a remaining oxidized layer on the element region of the semiconductor substrate; and (e) removing the remaining oxidized layer on the element region of the semiconductor substrate to expose said region.

2. The method according to claim 1, wherein an insulation layer is deposited on the semiconductor substrate and thereafter a layer of a material more quickly oxidizable than said semiconductor substrate is mounted thereon.

3. The method according to claim 2, wherein the insulation layer is prepared from at least one of a group consisting of silicon oxide and silicon nitride.

4. The method according to claim 1, wherein a material more quickly oxidizable than the semiconductor substrate is polycrystalline silicon undoped or doped with an impurity, or a silicide of molybdenum, tungsten or tantalum.

5. The method according to claim 1 or 4, wherein the selectively oxidized layer on the element region of the semiconductor substrate is removed to an extent equal to about three-fourths of the thickness of said oxidized layer, and later the wet oxidation is performed.

6. The method according to claim 1, 2 or 4, wherein an oxidized layer mounted on the element region of the semiconductor substrate by selective oxidation is wholly removed, and then the wet oxidation is performed.

7. The method according to claim 1, wherein an oxidized layer is deposited by selective oxidation on the element region of the semiconductor substrate, and an impurity is diffused in the semiconductor substrate by ion implantation with said oxidized layer used as a mask, thereby forming an inversion-preventing layer.

8. A method of manufacturing a semiconductor device which comprises the steps of:

(a) forming an insulation layer on a semiconductor substrate;

(b) forming on the insulation layer a layer of a material more quickly oxidizable than the semiconductor substrate;

(c) selectively oxidizing that portion of said more quickly oxidizable material layer which is located on the element region of the semiconductor substrate to provide an oxidized layer;

(d) removing at least part of the oxidized layer mounted on the element region of the semiconductor substrate;

(e) wet oxidizing the retained layer of the more quickly oxidizable material in such a manner than an unoxide portion is preserved in the retained layer, thereby producing an element-isolating oxide layer and also forming thereunder a conductive layer, the element-isolating oxide layer being thicker than said oxidized layer remaining on the element region of the semiconductor substrate; and (f) removing an oxidized layer remaining on the element region of the semiconductor substrate to expose said region.

9. The method according to claim 8, wherein the insulation layer is at least one of a group consisting of silicon oxide and silicon nitride.

10. The method according to claim 8, wherein the material more quickly oxidizable than the semiconductor substrate is polycrystalline silicon undoped or doped with an impurity, or a silicide of molybdenum, tungsten or tantalum.

11. The method according to claim 8 or 10, wherein the oxidized layer deposited on the element region of the semiconductor substrate by selective oxidation is removed to an extent equal to about three-fourths of the thickness of said oxidized layer, and the wet oxidation is performed.

12. The method according to claim 8 or 10, wherein the oxidized layer deposited on the element region of the semiconductor substrate is completely removed, and the wet oxidation is performed.

13. The method according to claim 8, wherein an oxidized layer is formed on the element region of the semiconductor device by selective oxidation, and an impurity is diffused in the semiconductor substrate by ion implantation with said oxidized layer used as a mask to provide an inversion-preventing layer.

* * * * *